(12) United States Patent
Wu et al.

(10) Patent No.: US 8,211,806 B2
(45) Date of Patent: Jul. 3, 2012

(54) METHOD OF FABRICATING INTEGRATED CIRCUIT WITH SMALL PITCH

(75) Inventors: Chia-Wei Wu, Jhubei (TW); Ling-Wu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 154 days.

(21) Appl. No.: 11/846,900

(22) Filed: Aug. 29, 2007

(65) Prior Publication Data

US 2009/0061624 A1 Mar. 5, 2009

(51) Int. Cl.
*H01L 21/302* (2006.01)
(52) U.S. Cl. .......... 438/717; 438/725; 438/723
(58) Field of Classification Search .......... 438/257, 438/669, 720, 717, 723, 725; 257/E21.038, 257/E21.039
See application file for complete search history.

(56) References Cited

U.S. PATENT DOCUMENTS

| 5,795,830 | A  | * | 8/1998  | Cronin et al. ........... 438/696 |
| 7,473,647 | B2 | * | 1/2009  | Lee et al. ............... 438/706 |
| 2002/0045308 | A1 | * | 4/2002  | Juengling ............... 438/238 |
| 2005/0272259 | A1 | * | 12/2005 | Hong ..................... 438/669 |
| 2007/0017310 | A1 | * | 1/2007  | Matsuzaki et al. ...... 74/335 |
| 2007/0117310 | A1 | * | 5/2007  | Bai et al. ............... 438/242 |
| 2008/0090416 | A1 | * | 4/2008  | Raghu et al. ........... 438/689 |

* cited by examiner

*Primary Examiner* — Steven Loke
*Assistant Examiner* — Kimberly M Thomas
(74) *Attorney, Agent, or Firm* — Jianq Chyun IP Office

(57) ABSTRACT

A method of manufacturing an integrated circuit with a small pitch comprises providing a second material layer patterned to form at least two features with an opening between the features. The second material layer is formed over a first material layer and the first material layer is over a substrate. The method also comprises providing a first oxide layer to form a first sidewall surrounding each of the features, and providing a second oxide layer over the first sidewalls and the first material layer. A second sidewall is formed surrounding each of the features. The method further comprises providing a conductive layer over the second oxide layer and removing the conductive layer, the second sidewalls and the first material underneath the second sidewalls.

13 Claims, 3 Drawing Sheets

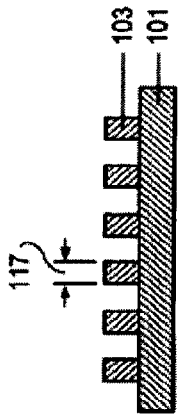
Fig. 1(d)
(Prior Art)
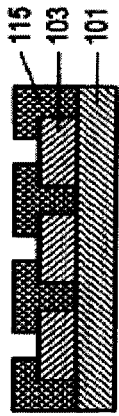
Fig. 1(e)
(Prior Art)
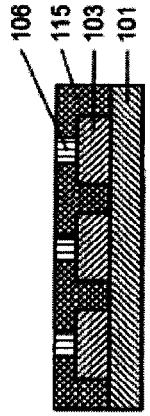
Fig. 1(f)
(Prior Art)
Fig. 1(g)
(Prior Art)
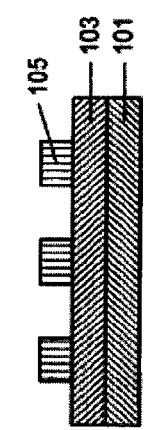
Fig. 1(a)
(Prior Art)
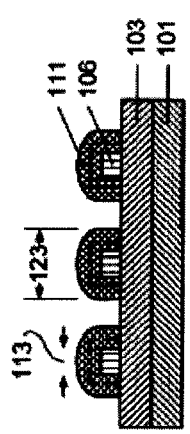
Fig. 1(b)
(Prior Art)
Fig. 1(c)
(Prior Art)

METHOD OF FABRICATING INTEGRATED CIRCUIT WITH SMALL PITCH

BACKGROUND OF THE INVENTION

1. Field of the Invention

This invention relates to a method of fabricating an integrated circuit, and more particularly, to a method for defining a small pitch.

2. Background of the Invention

Integrated circuits are commonly used in a variety of electronic devices, especially miniature electronic devices. While modern integrated circuits may have high device densities up to millions of devices per single chip, many applications require even higher densities. Thus, circuit designers often try to increase the level of integration or density of features within an integrated circuit by reducing the size of the individual features and by reducing the pitch (i.e., the center-to-center distance between two neighboring features) on an integrated circuit. Lithography is a manufacturing process that may achieve the objectives of higher density and smaller size. However, the lithography resolution may be limited by various factors, such as the equipment, the wavelength of light sources, and the type of masks used. Several resolutions have been proposed to obtain a small pitch in an integrated circuit that may be beyond the lithographic resolution currently available.

U.S. Pat. No. 7,183,205 to Hong proposed a method that can reduce the pitch in a device below what was producible by the lithographic process. Referring to FIGS. 1(a)-1(g), the method proposed includes a thermal oxidation process on a structure as in FIG. 1(a) to form the structure of FIG. 1(b). During the thermal oxidation, the polysilicon features 105 in FIG. 1(a) will shrink vertically and horizontally to develop into the features 106 in FIG. 1(b). An etching process is then performed to expose portions of substrate 101 as shown in FIG. 1(c). Following the etching process, a layer of silicon oxide 115 is deposited on the structure of FIG. 1(c) by high density plasma chemical vapor deposition (CVD) to form a structure as in FIG. 1(d). The CVD process is followed by a chemical mechanical planarization (CMP) to remove the layer 115 to the level to the top surface of the features 106 as shown in FIG. 1(e). The features 106 are removed by a plasma process as in FIG. 1(f). A final etching process is performed and results in the structure of FIG. 1(g) where the width 117 is narrower than the original width of the features 105 and the pitch is reduced.

U.S. Patent Publication No. 2007/0051982 proposed fabrication methods for obtaining a reduced pitch less than 2 F. With an initial structure as shown in FIG. 2(a) having a polysilicon layer 54 on top of an ONO layer 55 which is over a substrate 42, and a patterned nitride layer with features 60 over the polysilicon layer 54, the process starts with a SiN liner deposition to form a structure as in FIG. 2(b). Referring to FIG. 2(c), polysilicon is then deposited to fill in the spacer 61' between the two neighboring liners 62 which may be followed by a CMP process. After that, an etching process is performed to remove the liner 62 and nitride features 60 and leave the filled-in polysilicon 64 as shown in FIG. 2(d). As shown in FIG. 2(e), another liner 72 is deposited over the structure as in FIG. 2(d). An etching process and a second polysilicon deposition are performed which results in a structure as in FIG. 2(f). Referring to FIGS. 2(g) and 2(h), the liner 72 is then removed by a wet etching process, which is followed by a hard mask etching process to remove the polysilicon layer 54.

BRIEF SUMMARY OF THE INVENTION

One example consistent with the invention provides a method of manufacturing an integrated circuit with a small pitch. The method comprises providing a second material layer patterned to form at least two features with an opening between the features. The second material layer is formed over a first material layer and the first material layer is over a substrate. The method also comprises providing a first oxide layer to form a first sidewall surrounding each of the features, and providing a second oxide layer over the first sidewalls and the first material layer. A second sidewall is formed surrounding each of the features. The method further comprises providing a conductive layer over the second oxide layer and removing the conductive layer, the second sidewalls and the first material layer underneath the second sidewalls.

In another example, a method of manufacturing an integrated circuit with a small pitch comprises providing a substrate having a first material layer over the substrate and a second material layer over the first material layer, patterning the second material layer to form at least two first features with a first opening between the first features, and providing a first oxide layer to form a first sidewall surrounding each of the first features. A second opening is formed between two opposing first sidewalls and wherein the second opening is narrower than the first opening. The method also comprises providing a second oxide layer over the first sidewalls and the first material layer. A second sidewall is formed surrounding each of the first features. The method further comprises providing a conductive layer over the second oxide layer, planarizing the conductive layer to expose the second oxide layer, removing the conductive layer, the second sidewalls, and the first material layer underneath the second sidewalls to form a number of second features and expose portions of the substrate. A third opening is formed between each two neighboring second features and the third opening is narrower than the first opening.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings:

FIGS. 1(a)-1(g) are cross-sectional views of a memory cell for illustrating a processing technique in the prior art;

DETAILED DESCRIPTION OF THE INVENTION

Figure 2A:
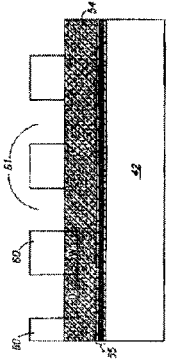
FIGS. 2(a)-2(h) are cross-sectional views of a memory cell for illustrating a processing technique in the prior art.
Figure 2B:
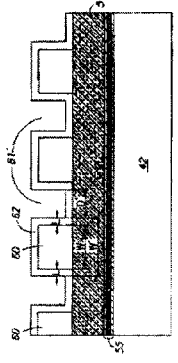
Figure 2C:
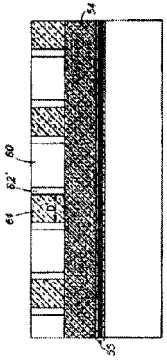
Figure 2D:
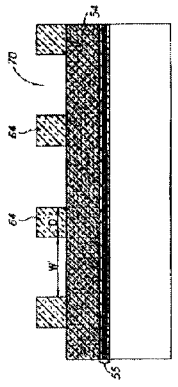
Figure 2E:
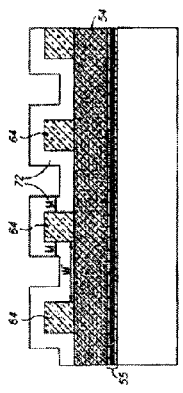
Figure 2F:
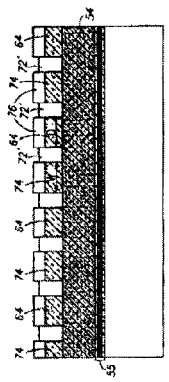
Figure 2G:
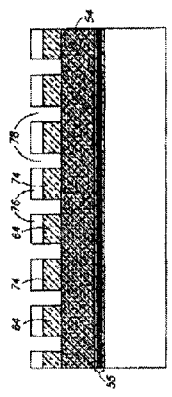
Figure 2H:
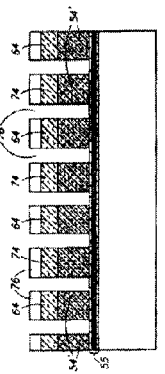
Figure 3D:
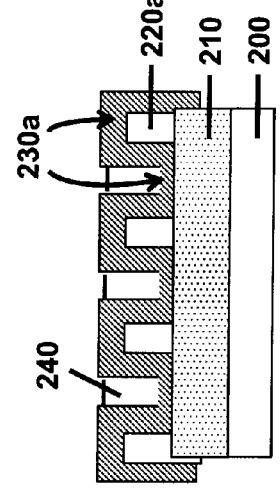
FIGS. 3(a)-3(f) are exemplary cross-sectional views of a memory cell for illustrating exemplary processing techniques in examples consistent with the present invention.
Figure 3E:
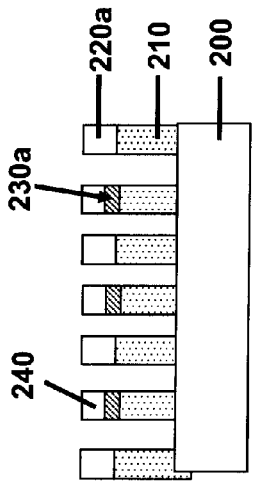
Figure 3F:
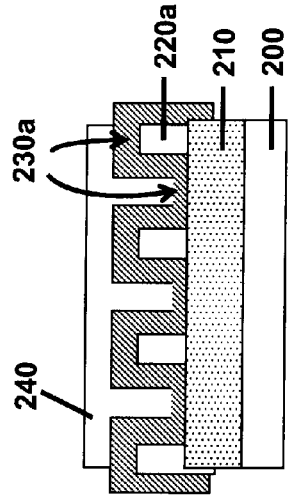
Figure 3A:
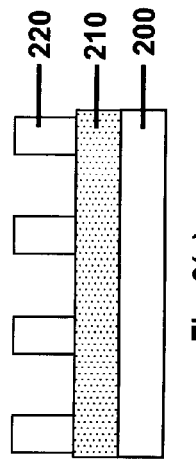

FIGS. 3(a)-3(f) are cross-sectional views of a memory cell for illustrating exemplary fabrication techniques in examples consistent with the present invention. FIG. 3(a) illustrates a structure that may have a substrate 200, a first material layer 210 and a second material layer patterned with features 220.

The substrate 200 may be a conductive material in one example. In some examples, the substrate 200 may be one of polysilicon or silicon-rich tungsten silicide. The layer referred to herein as the substrate 200 may include other layers or sub-layers that may be needed depending on the circuitry design. The first material layer 210 may be a dielectric layer. In one example, the first material layer 210 may be a layer of tetraethoxysilanes. The first material layer 210 may be in the range of a hundred or more, such as 155, nanometers (nm) in thickness. The second material layer may be a conductive layer, such as a polysilicon layer. In one example, the second material layer may be patterned by a dry etch or plasma etch to remove the portions not covered by an etching mask to form a number of features 220 as shown in FIG. 3(a). The dimensions for a feature 220 may be about 100 nm in height and 80 nm in width in one example, but can vary from tens of nanometers to a few hundred nanometers or more depending on the applications. The opening between each two neighboring features 220 may be about 140 nm in one example but can vary depending on applications.

Figure 3B:
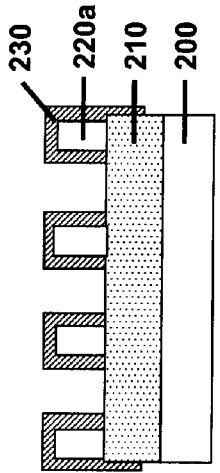

FIG. 3(b) illustrates the formation of a layer of liner oxide 230 on the top surfaces and sidewalls of the features 220 of FIG. 3(a). A thermal process, such as a rapid thermal oxidation process, may be used to form a layer of liner oxide 230, which is 280 Angstroms in thickness, surrounding the features 220 of FIG. 3(a). During the thermal processing, the dimension of each feature 220 of FIG. 3(a) may shrink vertically and horizontally to reduce the size of features 220 of FIG. 3(a) resulting in features 220a of FIG. 3(b). Thus, the dimensions for each feature 220a may be about 88 nm in height and 55 nm in width in one example. The width of the layer of liner oxide 230 at one sidewall of the feature 220a may be about 28 nm. Thus, the opening between two neighboring sidewalls becomes about 108 nm.

Figure 3C:
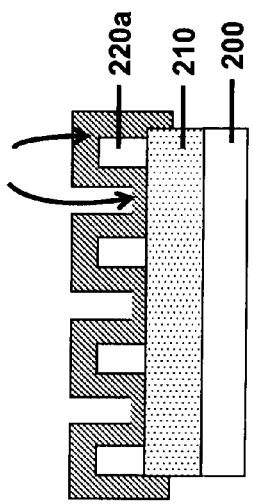

FIG. 3(c) illustrates the formation of another oxide layer. A second thermal process, such as a rapid thermal oxidation process, may be performed to form a layer oxide over the layer of liner oxide 230 and the first material layer 210 as shown in FIG. 3(c). Oxide layer 230a refers to the combination of the layer of silicon oxide and the layer of liner oxide 230. Referring to FIG. 3(c), the width of the oxide layer 230a at one sidewall of feature 220a may be larger than the width of the layer of liner oxide 230 at one sidewall of the feature 220a. As a result, the opening between two neighboring sidewalls becomes narrower and, in one example, may be less than 108 nm.

Referring to FIG. 3(d), a conductive layer 240 may be deposited over the oxide layer 230a. In one example, the conductive layer 240 may be made of polysilicon. Following the deposition of the conductive layer 240, a CMP process is performed to remove the conductive layer 240 down to the level to the top surfaces of the oxide layer 230a as shown in FIG. 3(e).

Referring to FIG. 3(f), an etching process, such as using an etching mask, may be performed to remove the remaining conductive layer 240, the oxide layer 230a surrounding the features 220a as well as the first material layer 210 underneath the oxide layer 230a at the sidewalls of the features 220a. As a result, portions of the substrate 200 are exposed as shown in FIG. 3(f). Following that, another etching process may be performed to remove materials above the substrate 200 as well as the exposed potion of the substrate 200 by using an etching mask. The resulting structure (not shown) becomes a number of features of the substrate with a reduced pitch between each two features.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A method of manufacturing an integrated circuit comprising:
    providing a substrate having a first material layer over the substrate and a second material layer over the first material layer, wherein the first material layer comprises a dielectric material;
    patterning the second material layer to form at least two first features with a first opening between the first features, wherein the first opening exposes a top surface of the first material layer;
    performing a thermal oxidation process to oxidize the first features and the first material layer so as to reduce each width of the first features and to form an oxide layer a surrounding each of the first features and on the first material layer;
    providing a conductive layer over the oxide layer;
    planarizing the conductive layer to expose the oxide layer; and
    removing the conductive layer, the oxide layer, and the first material layer underneath the oxide layer to form a number of second features and expose portions of the substrate, wherein a second opening is formed between each two neighboring second features and wherein the second opening is narrower than the first opening.

2. The method according to claim 1, wherein the substrate comprises a conductive material.

3. The method according to claim 1, wherein the second material layer comprises polysilicon.

4. The method according to claim 1, wherein the conductive layer comprises polysilicon.

5. The method according to claim 1, wherein the oxide layer includes a layer of liner oxide.

6. The method according to claim 1, wherein planarizing the conductive layer comprises using a chemical mechanical planarization process.

7. A method of manufacturing an integrated circuit comprising:
    providing a substrate having a first material layer over the substrate and a second material layer over the first material layer;
    patterning the second material layer to form at least two first features with a first opening between the first features, wherein the first opening exposes a top surface of the first material layer;
    performing a first thermal oxidation process to oxidize the first features so as to reduce each width of the first features and to form a first oxide layer surrounding each of the first features simultaneously, wherein a second opening is formed between two opposing first oxide layer and wherein the second opening is narrower than the first opening and exposes the first material layer at the bottom of the second opening;
    performing a second thermal oxidation process to form a second oxide layer over the first oxide layer and the first material layer;
    providing a conductive layer over the second oxide layer;
    planarizing the conductive layer to expose the second oxide layer; and
    removing the second oxide layer, the first oxide layer and the first material layer underneath the second oxide layer to form a number of second features and expose portions of the substrate, wherein a third opening is formed between each two neighboring second features and wherein the third opening is narrower than the first opening.

8. The method according to claim 7, wherein the first material layer comprises a dielectric material.

9. The method according to claim 7, wherein the substrate comprises a conductive material.

10. The method according to claim 7, wherein the second material layer comprises polysilicon.

11. The method according to claim 7, wherein the conductive layer comprises polysilicon.

12. The method according to claim 7, wherein the first oxide layer is a layer of liner oxide.

13. The method according to claim 7, wherein planarizing the conductive layer comprises using a chemical mechanical planarization process.

\* \* \* \* \*